US006859069B2

(12) United States Patent
Ajit

(10) Patent No.: US 6,859,069 B2
(45) Date of Patent: Feb. 22, 2005

(54) METHODS AND SYSTEMS FOR PROVIDING LOAD-ADAPTIVE OUTPUT CURRENT DRIVE

(75) Inventor: Janardhanan S. Ajit, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 10/704,901

(22) Filed: Nov. 12, 2003

(65) Prior Publication Data

US 2004/0155683 A1 Aug. 12, 2004

Related U.S. Application Data

(63) Continuation of application No. 10/245,273, filed on Sep. 18, 2002, now Pat. No. 6,690,199.
(60) Provisional application No. 60/357,862, filed on Feb. 21, 2002.

(51) Int. Cl.[7] .................. H03K 19/0175; H03K 19/094
(52) U.S. Cl. ............................. 326/87; 326/27; 326/83; 327/332
(58) Field of Search .............................. 326/87, 27, 83, 326/26, 34; 327/332, 381

(56) References Cited

U.S. PATENT DOCUMENTS

| 5,153,457 | A | | 10/1992 | Martin et al. | |
| 6,271,709 | B1 | * | 8/2001 | Kimura et al. | 327/380 |
| 6,388,486 | B1 | * | 5/2002 | Schultz | 327/170 |
| 6,545,503 | B1 | | 4/2003 | Tomasini et al. | |

FOREIGN PATENT DOCUMENTS

EP  1 091 492 A1   4/2001

* cited by examiner

*Primary Examiner*—Daniel D. Chang
(74) *Attorney, Agent, or Firm*—Sterne, Kessler, Goldstein & Fox PLLC

(57) ABSTRACT

Methods and systems for sensing load conditions and for adjusting output current drive according to the sensed load conditions to maintain one or more signal characteristics within a desired range. Load conditions are sensed by monitoring one or more signal characteristics that are affected by load conditions, such as voltage changes with respect to time. Output current drive is then adjusted, as needed, to maintain the one or more desired signal characteristics. In an embodiment, rising and/or falling edge slopes are monitored. For example, a dV/dt may be monitored. The dV/dt can be monitored by coupling a capacitance to the output signal, generating a current with the capacitance, and generating a voltage from the current. The voltage is generally proportional to the dV/dt. Depending upon the load conditions, a supplemental current is generated and/or adjusted and added to the output signal to maintain the desired signal characteristics within a desired range. For example, where dV/dt is monitored, the supplemental current is generated and/or adjusted to maintain the dV/dt within a desired range. In this way, the desired signal characteristic(s) are substantially maintained within the desired range for a range of load values. One or more signal characteristics may be maintained over a load range of 50 pF to 600 pF. Signal characteristics may be sensed and maintained only during rising and falling edges. Signal characteristics may be separately sensed and maintained for rising and falling edges of data signals.

13 Claims, 9 Drawing Sheets

METHODS AND SYSTEMS FOR PROVIDING LOAD-ADAPTIVE OUTPUT CURRENT DRIVE

CROSS-REFERENCE TO RELATED APPLICATIONS

This application is a continuation of U.S. application Ser. No. 10/245,273, titled "Methods and Systems for Providing Load-Adaptive Output Current Drive," filed Sep. 18, 2002, now U.S. Pat. No. 6,698,199, which claimed priority to U.S. Provisional Application No. 60/357,862, titled, "Methods and Systems for Providing Load-Adaptive Output Current Drive," filed Feb. 21, 2002, both of which are incorporated herein by reference in their entireties.

BACKGROUND OF THE INVENTION

1. Field of the Invention

The present invention is related to input/output ("I/O") circuits and, more particularly, to methods and systems for sensing load conditions and for adjusting output current drive according to the sensed load conditions to maintain one or more signal characteristics within a desired range.

2. Background Art

Input/Output ("I/O") circuits need to interface with different loads. Loads can vary from, for example, 50 pF–600 pF. Load variations can affect signal characteristics, such as rise and/or fall times. For example, loads with lower impedances tend to drain current faster from I/O circuits, which tends to decrease rise and fall times.

In many situations, signal characteristics, such as rise and/or fall times, need to be within a specified range. For example, certain interface standards, such as USB and PCI, require rise/fall times to be within a specified range.

What are needed are methods and systems for sensing load conditions and for adjusting output current drive as necessary to maintain one or more desired signal characteristics.

BRIEF SUMMARY OF THE INVENTION

The present invention is directed to methods and systems for sensing load conditions and for adjusting output current drive according to the sensed load conditions to maintain one or more signal characteristics within a desired range. In an embodiment, load conditions are sensed by monitoring one or more signal characteristics that are affected by load conditions, such as voltage changes with respect to time. Output current drive is then adjusted as needed to maintain the one or more desired signal characteristics.

In accordance with an aspect of the invention, a primary output current is generated in response to a received data signal. The primary output current is provided as an output signal to an output node. The output signal is then monitored for load conditions. For example in an embodiment, slopes of rising and/or falling edge of the output signal are monitored. Slopes of rising and/or falling edges of the output signal can be monitored by, for example, measuring changes in voltage over time (i.e., $dV/dt$) in the output signal. $dV/dt$ can be measured by coupling a capacitance to the output node, generating a current with the capacitance, and generating a voltage from the current. The voltage is generally proportional to the $dV/dt$. Depending upon the load conditions, a supplemental current is generated and/or adjusted and added to the primary output current to maintain the desired signal characteristics within a desired range. For example, where $dV/dt$ is monitored, the supplemental current is generated and/or adjusted to maintain the $dV/dt$ within a desired range. In this way, the desired signal characteristic(s) are substantially maintained within the desired range for a range of load values. The invention may be implemented to maintain one or more signal characteristics over a range of load values. For example, the invention may be implemented to maintain one or more signal characteristics over a load range of 50 pF to 600 pF.

The invention may be implemented to sense and maintain signal characteristics only during rising and falling edges. The invention may be implemented to separately sense and maintain signal characteristics for rising and falling edges of the output signal. This tends to simplify circuit designs.

Example circuit diagrams are provided for implementing various aspects of the invention.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The present invention will be described with reference to the accompanying drawings. The drawing in which an element first appears is typically indicated by the leftmost digit(s) in the corresponding reference number.

DETAILED DESCRIPTION OF THE INVENTION

The present invention is directed to input/output ("I/O") circuits and, more particularly, to methods and systems for sensing load conditions and for adjusting output current drive according to the sensed load conditions to maintain one or more signal characteristics within a desired range.

Load conditions are sensed by monitoring one or more signal characteristics that are affected by load conditions, such as voltage changes with respect to time. Output current drive is then adjusted as needed to maintain the one or more desired signal characteristics.

Figure 1:
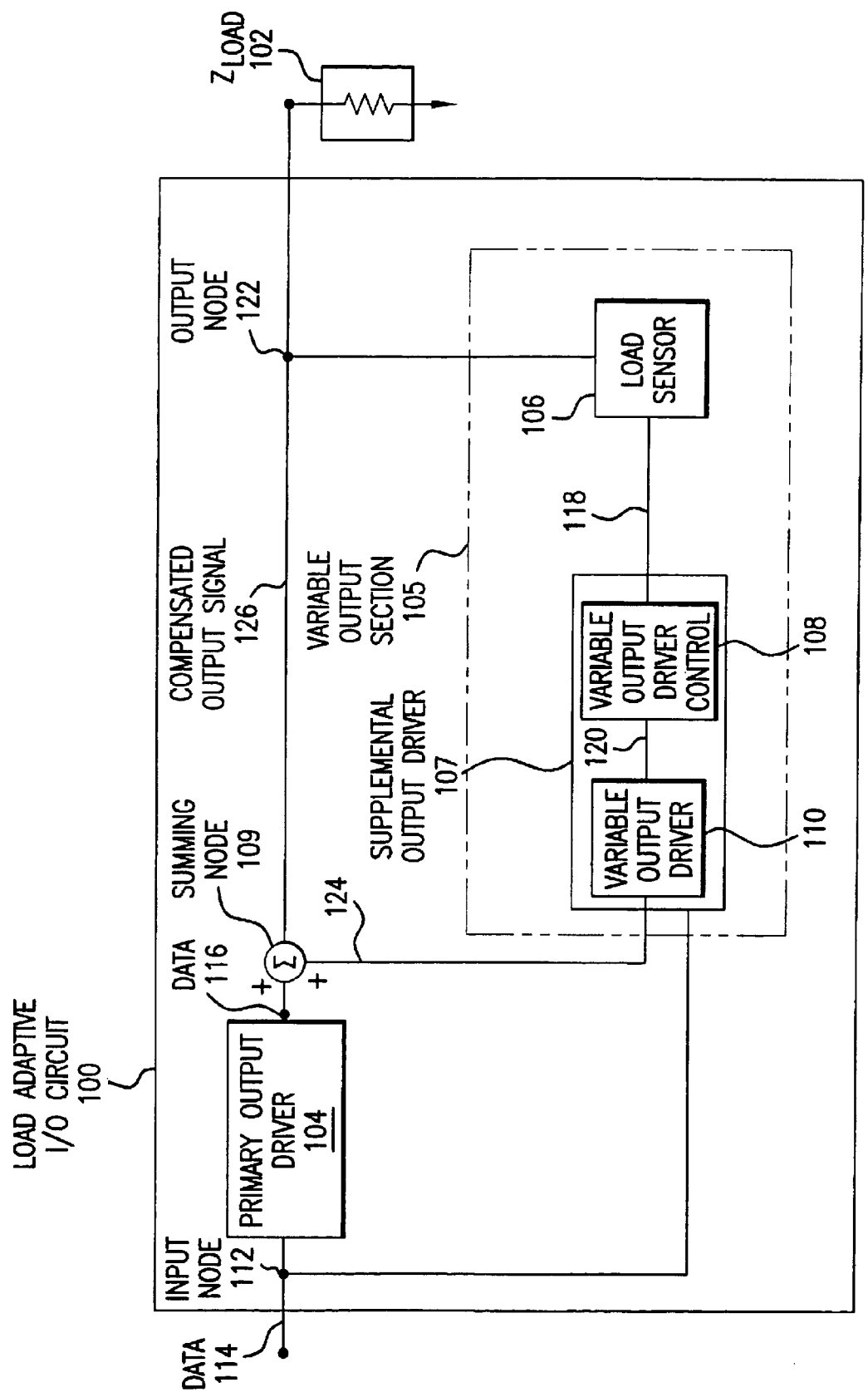
FIG. 1 is a high level block diagram of a load-adaptive current drive input/output ("I/O") circuit in accordance with the present invention.

FIG. 1 is a high level block diagram of a load-adaptive input/output ("I/O") circuit 100, in accordance with the present invention. The I/O circuit 100 is coupled to a load 102 having an impedance $Z_L$. The I/O circuit 100 provides one or more relatively constant signal characteristics, such as rise/fall times, over a range of impedances $Z_L$. For example, the I/O circuit 100 may provide relatively constant rise/fall times over a $Z_L$ impedance range of 50 pF–600 pF.

The I/O circuit 100 includes a primary output driver 104 and a variable output section 105. The primary output driver 104 receives an input data signal 114 from an input node 112 and provides an output data signal 116 to the load 102. In an embodiment, the output data signal 116 is substantially similar to the input data signal 114. In an alternative embodiment, the output data signal 116 is an inverted form of the input data signal 114. In an embodiment, the primary output driver 104 is a current drive or current source. Generally, signal characteristics of the output data signal 116, such as rise and/or fall times, depend on the drive power of the primary output drive 104 and the impedance of the load 102. For example, for a given current drive power, rise/fall times will be smaller for lower impedance loads 102.

Some applications will require that signal characteristics of the output data signal 116 be within a specified range. When the impedance of the load 102 is known in advance, the primary output drive 104 can be designed to provide a suitable current drive to maintain the signal characteristics of the output data signal 116 within the specified range. For example, for lower load impedances, the primary output drive 104 can be implemented with wider track widths and/or with multiple parallel current sources. In many situations, however, the impedance of the load 102 is not known in advance. This is often the case where, for example, the I/O circuit 100 is designed and manufactured by a first entity, and implemented with other circuits, such as the load 102, by a second entity.

The I/O circuit 100 could be implemented with wider track widths and/or with multiple parallel current sources so that it will supply adequate current regardless of the load 102. However, in many situations, it is desirable to reduce power consumption whenever possible. In accordance with an aspect of the invention, therefore, the primary output drive 104 is designed to provide a relatively moderate current drive. For example, the primary output drive 104 provides a current sufficient to maintain desired rise/fall times for a relatively high impedance load 102. For lower impedances, the variable output section 105 provides a supplemental current 124 as needed to maintain one or more desired signal characteristics.

The variable output section 105 is now described. The variable output section 105 includes a load sensor 106 and a supplemental output driver 107. The supplemental output driver 107 includes a variable output driver control 108 and a variable output driver 110. The load sensor 106 senses one or more signal characteristics at an output node 122 and provides a sensor signal 118 to the supplemental output driver 107. The supplemental output driver 107 outputs/adjusts the supplemental current 124 as needed to maintain the one or more signal characteristics at the output node 122 within a desired range. The supplemental current 124 is combined with the output data signal 116 at a summing node 109, resulting in a compensated output signal 126.

The load sensor 106 is now described. The load sensor 106 senses one or more signal characteristics of the compensated output signal 126 that are related to the load 102. For example, in an embodiment, the load sensor 106 senses changes in voltage with respect to time ("dV/dt") at the output node 122. The load sensor 106 outputs one or more sensor signals 118 indicative of the one or more signal characteristics. For example, where the load sensor 106 senses the dV/dt of the output signal 126, the load sensor 106 outputs a sensor signal 118 that is proportional to the dV/dt. In an alternative embodiment, the load sensor 106 outputs a sensor signal 118 that is inversely proportional to the dV/dt.

In an embodiment, the load sensor 106 includes a capacitance Cf, which generates a current:

$$i = C_f \frac{dV}{dt} \quad \text{(Eq. 1)}$$

In an embodiment, the load sensor further includes a resistance R in series with the capacitance Cf. When the current i flows through the resistance R, it generates a voltage:

$$V = iR \quad \text{(Eq. 2)}$$

Combining equations (1) and (2) provides equation (3):

$$V = C_f \frac{dV}{dt} \cdot R \quad \text{(Eq. 3)}$$

The voltage V generally changes in proportion to dV/dt changes at the output node 122. The voltage V is output as the sensor signal 118 to the variable output driver control 108.

In the supplemental output driver 107, the variable output driver control 108 receives one or more sensor signals 118 from the load sensor 106 and generates one or more variable output driver control signals 120, which control the variable output driver 110. The variable output driver 110 generates/adjusts the supplemental current 124, which is added to the output data signal 116 at a summing node 109.

Figure 2:
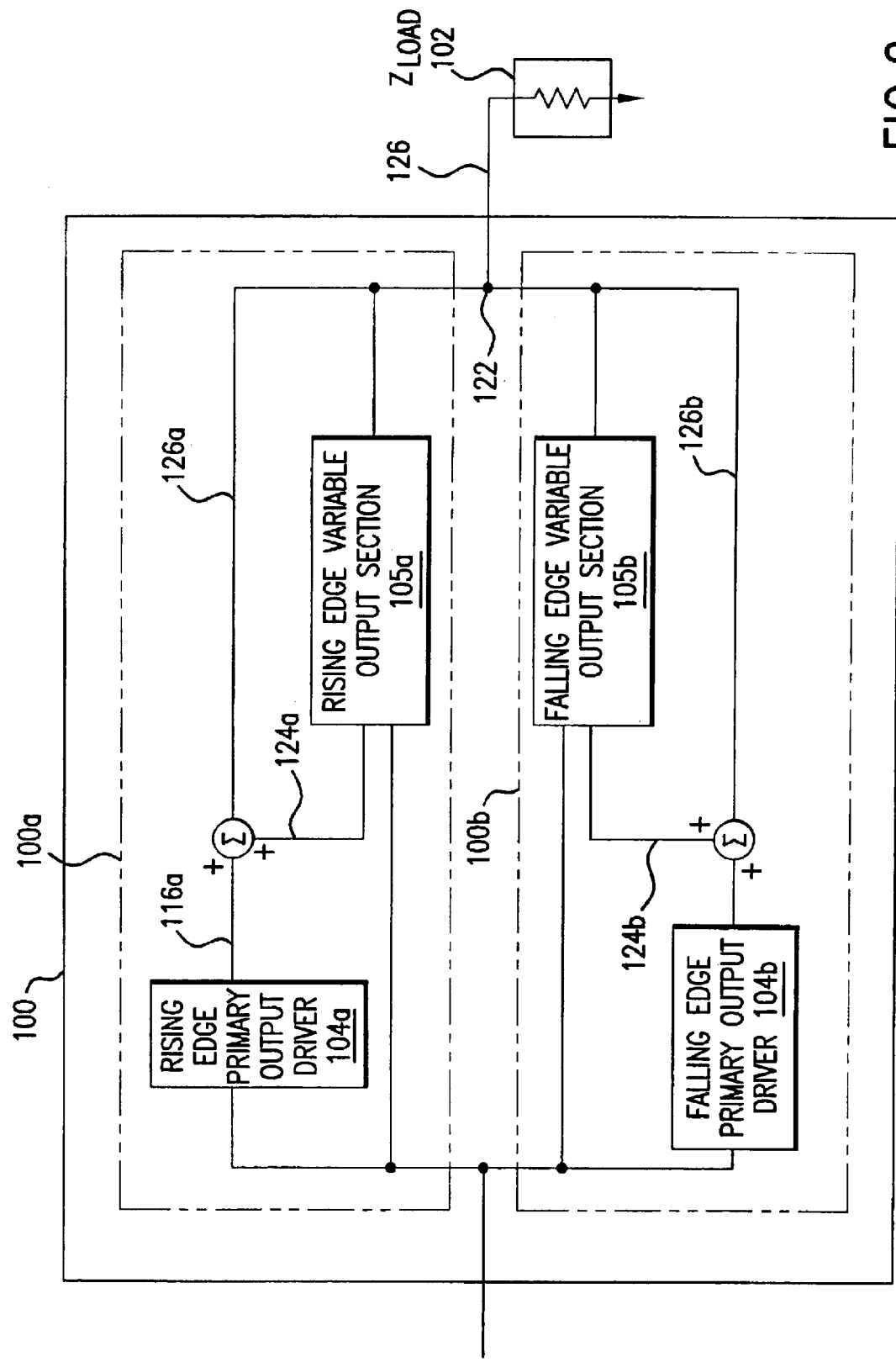
FIG. 2 is a block diagram of the I/O circuit illustrated in FIG. 1, including a rising edge portion and a falling edge portion.

In an embodiment, the I/O circuit 100 is implemented with a rising edge portion and a falling edge portion, which separately sense rising edge and falling edge load characteristics and/or separately control rising edge and falling edge supplemental current. Separate rising edge and falling edge portions tend to simplify circuit implementation details. FIG. 2 is an example block diagram of the I/O circuit 100 including a rising edge portion 100a and a falling edge portion 100b. The rising edge portion 100a includes a rising edge primary output driver 104a and a rising edge variable output section 105a. The falling edge portion 100b includes a falling edge primary output driver 104b and a falling edge variable output section 105b.

Figure 3A:
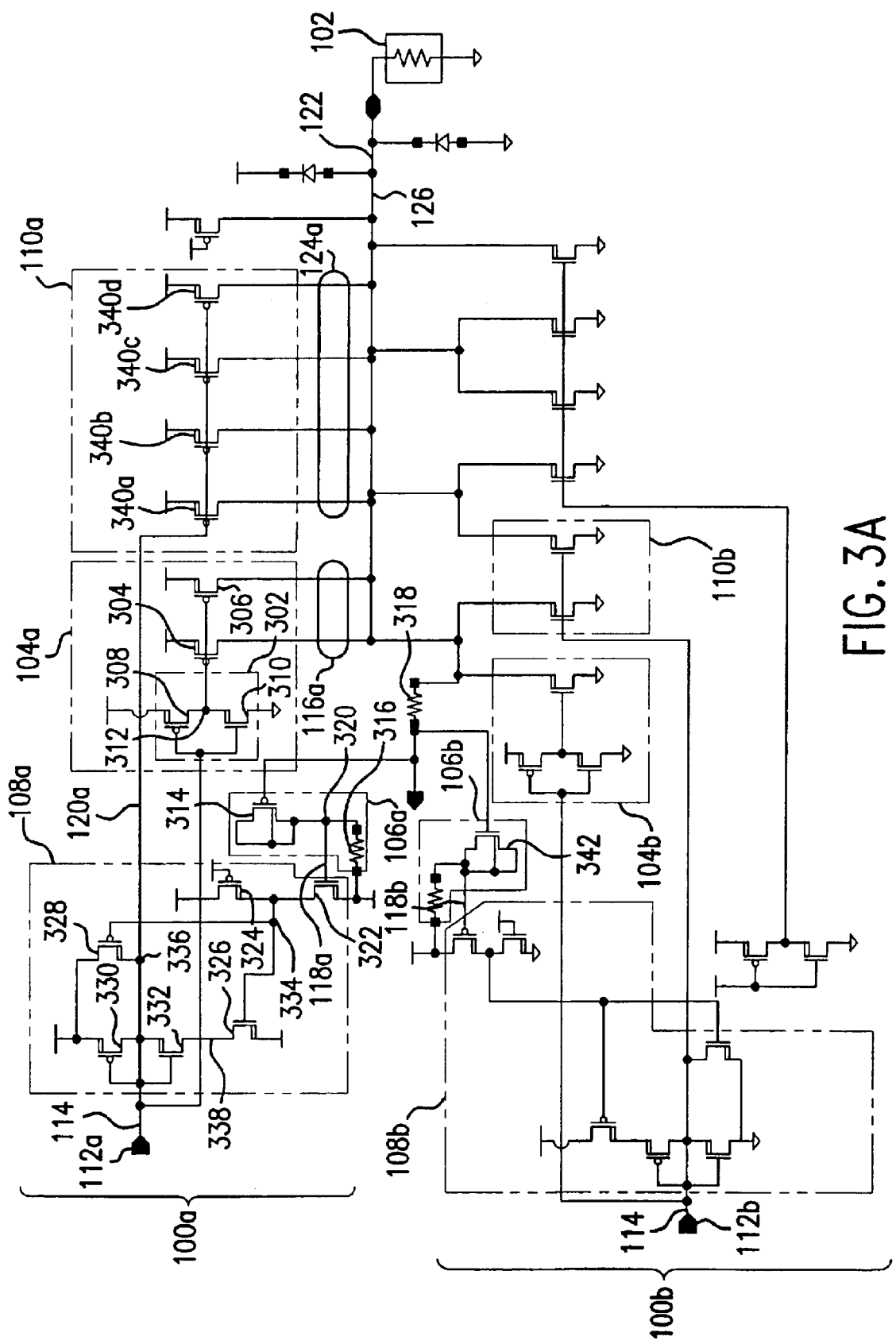
FIG. 3A is an example schematic diagram for the I/O circuit of FIG. 2.

FIG. 3A illustrates an example schematic diagram of the I/O circuit 100, including rising edge portion 100a and falling edge portion 100b. The rising edge portion 100a is now described. The rising edge primary output driver 104a includes an inverter 302, illustrated here as a PMOS transistor 308 and an NMOS transistor 310. The rising edge primary output drive 104a also includes one or more driver transistors, illustrated here as PMOS transistors 304 and 306.

Operation of the inverter 302 is now described. As the input data signal 114 rises, the PMOS 308 turns off and the NMOS 310 turns on. This couples a node 312 to a relatively low potential, illustrated here as VDDC. Thus, when the input data signal 114 is high, the inverter 302 outputs a low signal at the node 312. As the input data signal 114 falls, the PMOS 308 turns on and the NMOS 310 turns off. This couples the node 312 to a relatively high potential, illustrated here as VDDO. Thus, when the input data signal 114 is low, the inverter 302 outputs a high signal at the node 312.

Operation of the driver PMOS transistors 304 and 306 is now described. The node 312 is coupled to gates of the PMOS transistors 304 and 306. Source terminals of the PMOS transistors 304 and 306 are coupled to a relatively high potential, illustrated here as VDDO. Drain terminals of the PMOS transistors 304 and 306 are coupled to the output node 122. When the node 312 is low (i.e., when the input data signal 114 is high), the PMOS transistors 304 and 306 turn on, which couples the relatively high potential VDDO to the output node 112. Thus, when the input data signal 114 is high, the rising edge primary output driver 104a outputs output data signal 116a as a high signal at the output terminal 122. Conversely, when the node 312 is high (i.e., when the input data signal 114 is low), the PMOS transistors 304 and 306 turn off, which de-couples the relatively high potential VDDO from the output node 112. Thus, when the input data signal 114 is low, the rising edge primary output driver 104a has substantially no effect at the output terminal 122.

The rising edge load sensor 106a is now described. The rising edge load sensor 106a includes a capacitor 314, illustrated here as a PMOS transistor ("PMOS transistor 314"), configured as a capacitor. A gate terminal of the transistor 314 is coupled to the output node 122. In the example of FIG. 2, the gate terminal of the PMOS transistor 314 is coupled to the output node 122 through an optional electrostatic discharge ("ESD") resistor 318. Source and drain terminals of the PMOS transistor 314, along with the substrate of the PMOS transistor 314, are coupled together to a relatively low potential, illustrated here as VDDC, through a resistor 316.

In operation, when the compensated output signal 126 at the output node 122 is at a steady state, the N-channel of the PMOS transistor 314 is stable and substantially no charge flows across the source/gate junction of the PMOS transistor 314. When the compensated output signal 126 is increasing, (i.e., positive dV/dt at the output node 122), charge flows from the gate to the source/drain terminals of the PMOS transistor 314 as the PMOS transistor 314 adapts to the changing voltage. The charge flows from the PMOS transistor 314, through the resistor 316, to the relatively low potential VDDC. The charge, or current flow, through the resistor 316 is relatively small compared to current flow through the load 102. The current flow through the resistor 316 generates a positive voltage across the resistor 316, relative to VDDC, as measured at a node 320 (i.e., the sensor signal 118a). The current through the transistor 314 is generally proportional to voltage changes (i.e., dV/dt) at the output node 122. Thus, the voltage at the node 320 is also generally proportional to changes in the voltage at the output node 122. In other words, when the rate of voltage change at the output node 122 is relatively high, the voltage at the input node 112 is relatively high. Conversely, when the rate of voltage change at the output node 122 is relatively low, the voltage at the input node 112 is relatively low. When the dV/dt at the output node 122 is negative, indicating a falling edge, a negative voltage is generated at the node 320. A negative potential at the node 320 has substantially the same effect as zero dV/dt, which has substantially no effect on the rising edge variable output section 105a.

When the load 102 is a relatively high impedance load, the compensated output signal 126 signal characteristics, such as rising edge slopes and falling edge slopes (dV/dt) tend to be relatively high. In this case, the rising edge primary output driver 104a typically provides sufficient current to the output node 122 and there is little or no need for supplemental current 124.

When the load 102 is a lower impedance load, signal characteristics, such as rising edge slopes and falling edge slopes (dV/dt) tend to be relatively low. In this case, the rising edge variable output section 105a provides supplemental current 124 as needed to maintain the signal characteristics of the output signal 126 within a desired range.

The rising edge variable output section 105a is now described. The rising edge variable output section 105a includes the variable output driver controller 108a and the variable output driver 110a.

Operation of the rising edge variable output driver control 108a is now described for relatively high dV/dt at the output node 122. The rising edge variable output driver control 108a includes PMOS transistors 324, 328, and 330, and NMOS transistors 322, 326, and 332. A gate terminal of the NMOS transistor 322 is coupled to the node 320. A source terminal of the NMOS transistor 322 is coupled to the relatively low potential VDDC. A drain terminal of the NMOS transistor 322 is coupled to a node 334. The node 334 is also coupled to a drain terminal of the PMOS transistor 324. A source terminal of the PMOS transistor 324 is coupled to the relatively high potential VDDO. A gate terminal of the PMOS transistor 324 is coupled to the relatively low potential VDDC. The PMOS transistor 324 is thus permanently turned on. Node 324 thus tends to be pulled up towards the relatively high potential VDDO. However, recall from above that as the dV/dt at the output node 122 increases, the voltage at the node 320 increases. As the voltage at the node 320 increases, the NMOS transistor 322 increasingly turns on. This increasingly couples the node 334 to the relatively low potential VDDC, which tends to pull the node 334 down toward the relatively low potential VDDC.

The node 334 is also coupled to gates of the PMOS transistor 328 and the NMOS transistor 326. As the potential of the node 334 falls, the transistor 328 turns on and the NMOS transistor 326 turns off. As the PMOS transistor 328 turns on, a node 336 (i.e., variable output driver control signal 120a), is increasingly coupled to the relatively high potential VDDO. As the NMOS transistor 326 turns off, it increasingly isolates a node 338 from the relatively low potential VDDC.

The node 338 is coupled to a source terminal of the NMOS transistor 332. A drain terminal of the NMOS transistor 332 is coupled to the node 336. A gate terminal of the NMOS transistor 332 receives the input data signal 114. As the input data signal 114 rises, the NMOS transistor 332 turns on, which couples the node 336 to the node 338. However, since the node 338 is increasingly isolated from the relatively low potential VDDC, the node 336 is increasingly coupled to the relatively high potential VDDO. A gate terminal of the PMOS transistor 330 also receives the input data signal 114. As the input data signal 114 rises, the PMOS transistor 330 turns off, which isolates the node 336 from the relatively high potential of VDDO through PMOS 330. Thus, as dV/dt increases at the output node 122, the node 336 (i.e., the variable output driver control signal 120) tends towards the relatively high potential VDDO.

Operation of the rising edge variable output driver control 108a is now described for relatively low dV/dt at the output node 122. Recall from above that at lower dV/dt, the node 320 (i.e., the sensor signal 118a), is relatively low. This turns the NMOS transistor 322 off, which allows the node 334 to rise towards VDDO. As the node 334 rises, the PMOS transistor 328 turns off, which increasingly isolates the node 336 from the relatively high potential VDDO.

As the node 334 rises, the NMOS transistor 326 increasingly turns on, which increasingly couples the node 338 to the relatively low potential VDDC. When the input data signal 114 is high, the PMOS transistor 330 turns off and the NMOS transistor 332 turns on. This couples the relatively low potential VDDC at the node 338 to the node 336. Thus, as dV/dt decreases at the output terminal 122, provided that the input data signal 114 is high, the node 336 (i.e., the variable output drive control signal 120), is increasingly coupled to the relatively low potential VDDC through the NMOS transistors 332 and 326

Operation of the rising edge variable output driver 110a is now described. The variable output driver 110a includes one or more driver transistors, illustrated here as PMOS transistors 340a through 340d. The PMOS driver transistors 340a through 340d serve as voltage-controlled current sources. The PMOS driver transistors 340a through 340d include source terminals coupled to the relatively high potential VDDO and drain terminals coupled to the output node 122. Gate terminals of the PMOS transistors 340a through 340d are coupled to and controlled by the node 336 (i.e., the variable output drive control signal 120a).

Recall from above that as dV/dt increases at the output node 122, the node 336 rises towards VDDO. As the node 336 rises towards VDDO, the PMOS transistors 340a through 340d are increasingly turned off, resulting in less supplemental current 124a. Recall further from above that as dV/dt decreases at the output node 122, the node 336 falls towards VDDC. As the node 336 falls towards VDDC, the PMOS transistors 340a through 340d are increasingly turned on, resulting in more supplemental current 124a.

To summarize operation of the rising edge portion 100a, when the rising edge (dV/dt) is relatively high, which is typically the case when the load 102 is a relatively high impedance load, the load sensor 106a outputs a relatively high sensor signal 118a. The variable output drive control 108a receives the relatively high sensor signal 118a and outputs a relatively high variable output driver control signal 120a. The variable output driver 110a receives the relatively high variable output driver control signal 120a and reduces or terminates the supplemental current 124a.

Conversely, when the rising edge (dV/dt) is relatively low, which is typically the case when the load 102 is a relatively low impedance load, the load sensor 106a outputs a relatively low sensor signal 118a. The variable output drive control 108a receives the relatively low sensor signal 118a and outputs a relatively low variable output driver control signal 120a. The variable output driver 110a receives the relatively low variable output driver control signal 120a and increases the supplemental current 124a. The variable output driver 110a will continue to increase the supplemental current 124a until the dV/dt rises to within a range for which the rising edge variable output section 105a is designed. In this way, the I/O circuit 100 insures a relatively constant dV/dt at the output node 122.

The amount of control provided by the sensor 106a, the variable output driver control 108a, and the variable output driver 110a, depends primarily on the number of driver transistors 340a–340d, the value of the capacitance of the capacitor 314, the resistance of the resistor 316, and the characteristics of the NMOS transistors 322 and 326.

Based on the description herein, one skilled in the relevant art(s) will understand that the falling edge portion 100b operates in a similar manner.

Figure 3B:
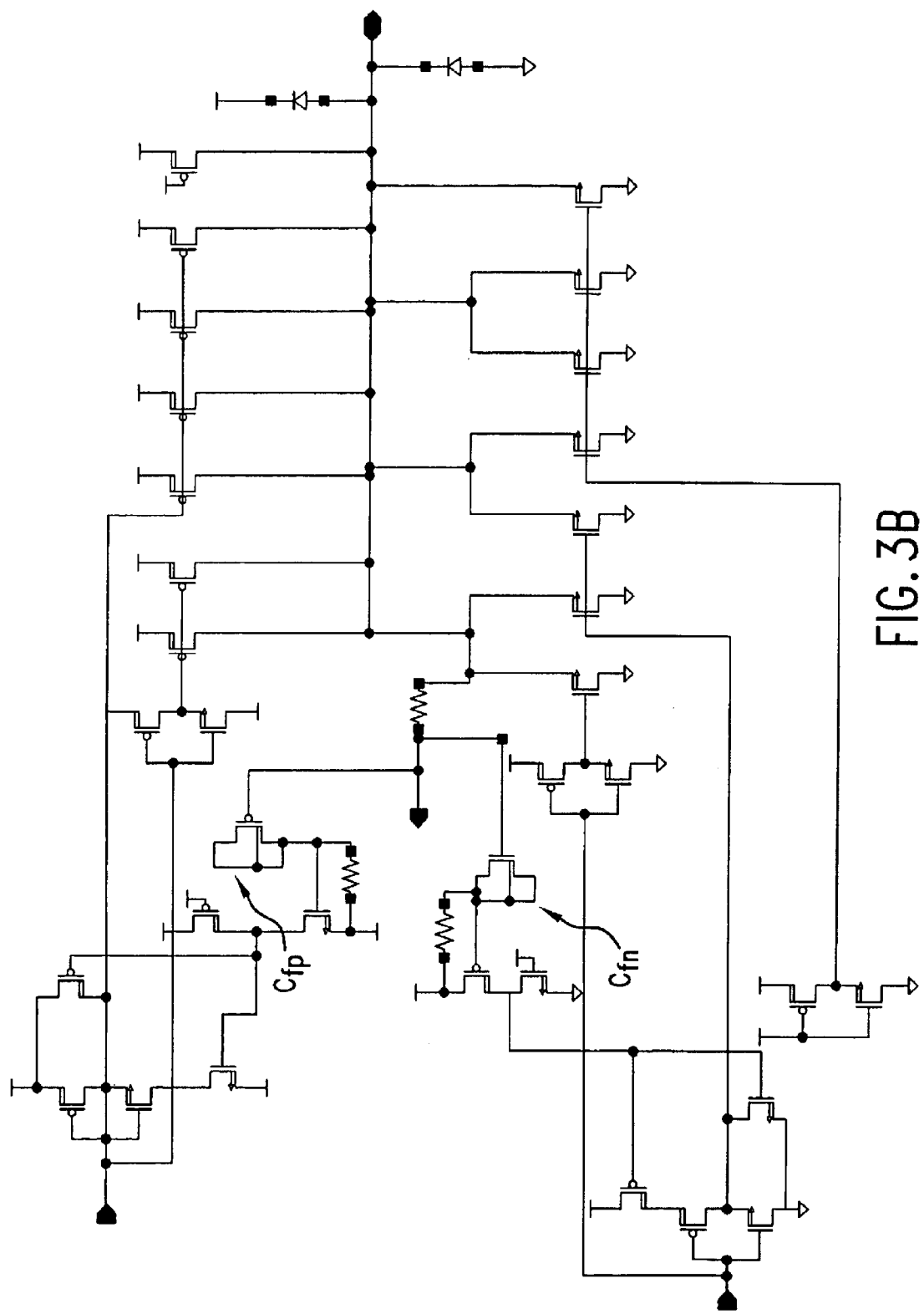
FIG. 3B illustrates example component characteristic values for the I/O circuit of FIG. 3A.

The rising edge variable output section 105 can be designed for a variety of ranges of loads and/or dV/dt ranges by selecting components with suitable operating characteristics. FIG. 3B illustrates the I/O circuit 100 of FIG. 3A with example component characteristic values. The invention is not, however, limited to the example of FIG. 3B. Based on the description herein, one skilled in the relevant art(s) will understand that the I/O circuit 100 illustrated in FIG. 3A can be implemented with other component characteristic values as well.

Operation of the I/O circuit 100 is now described with respect to FIG. 3B.

A pad is driven by PMOS transistors MPd1 through MPd6, and NMOS transistors MNd1 through MNd6. Each transistor or a group of transistors is referred to herein as a finger. Connected to the pad is a capacitor Cfp. When the pad voltage is being pulled-up by the PMOS MPd1 through MPd6, the voltage at the pad rises. The change in pad voltage (dV/dt) causes a current to flow through the capacitor Cfp and this pulls-up a node Ap to a potential that is dependent on the dV/dt. When the potential of the node Ap increases, the conductivity of an NMOS transistor MNfp is increased and the NMOS transistor MNfp1 starts to pull down a node Bp, which is coupled to a gate of an NMOS transistor MNfp2. This decreases the conductivity of the NMOS transistor MNfp2, reducing the gate drive of the PMOS transistors MPd2 through MPd5. Thus the gate drive is adjusted so that the current supplied to the load changes depending on the load. A low load condition gives an initial high dV/dt, which results ultimately in a low current being sourced to the load. A high load condition gives an initial low dV/dt, which results ultimately in a high current being sourced to the load 102, thereby keeping the charging time of the load (rise time of pad voltage waveform) almost constant irrespective of the load. The amount of control of the current depends on the number of fingers controlled by each of the capacitive feedback circuits, the value of the capacitor Cf, resistor Rp, NMOS transistor Nfp1, and NMOS Nfp2.

When the pad voltage is being pulled down by NMOS MNd, the voltage at the pad decreases. This change in pad voltage (–dV/dt) causes a current to flow through the capacitor Cfn and this pulls down the node An to a potential that is dependent on the dV/dt. When the potential of a node An decreases, the conductivity of PMOS MPfn1 is increased and PMOS MPfn1 starts to pull down the node Bn, which is coupled to a gate of PMOS MPfn2. This decreases the conductivity of PMOS MPfn2, reducing the gate drives of NMOS MNd1 and MNd2. Thus, the gate drive is adjusted so that the current sinked from the load changes with the load resulting in the discharging time of the load (fall time of pad voltage waveform) being almost constant.

The output PMOS and NMOS transistors include several parallel devices (fingers). This concept can be applied to several sections of the fingers depending on the level of control of the current required. For example, if the output PMOS transistors includes three fingers, each of which supplies 4 mA, depending upon the load, this circuit can be used to enable one finger, thereby sourcing 4 mA to the load, or enable two fingers, thereby sourcing 8 mA to the load, or enable three fingers, thereby sourcing 12 mA to the load. The invention is not, however, limited to these examples.

Figure 4A:
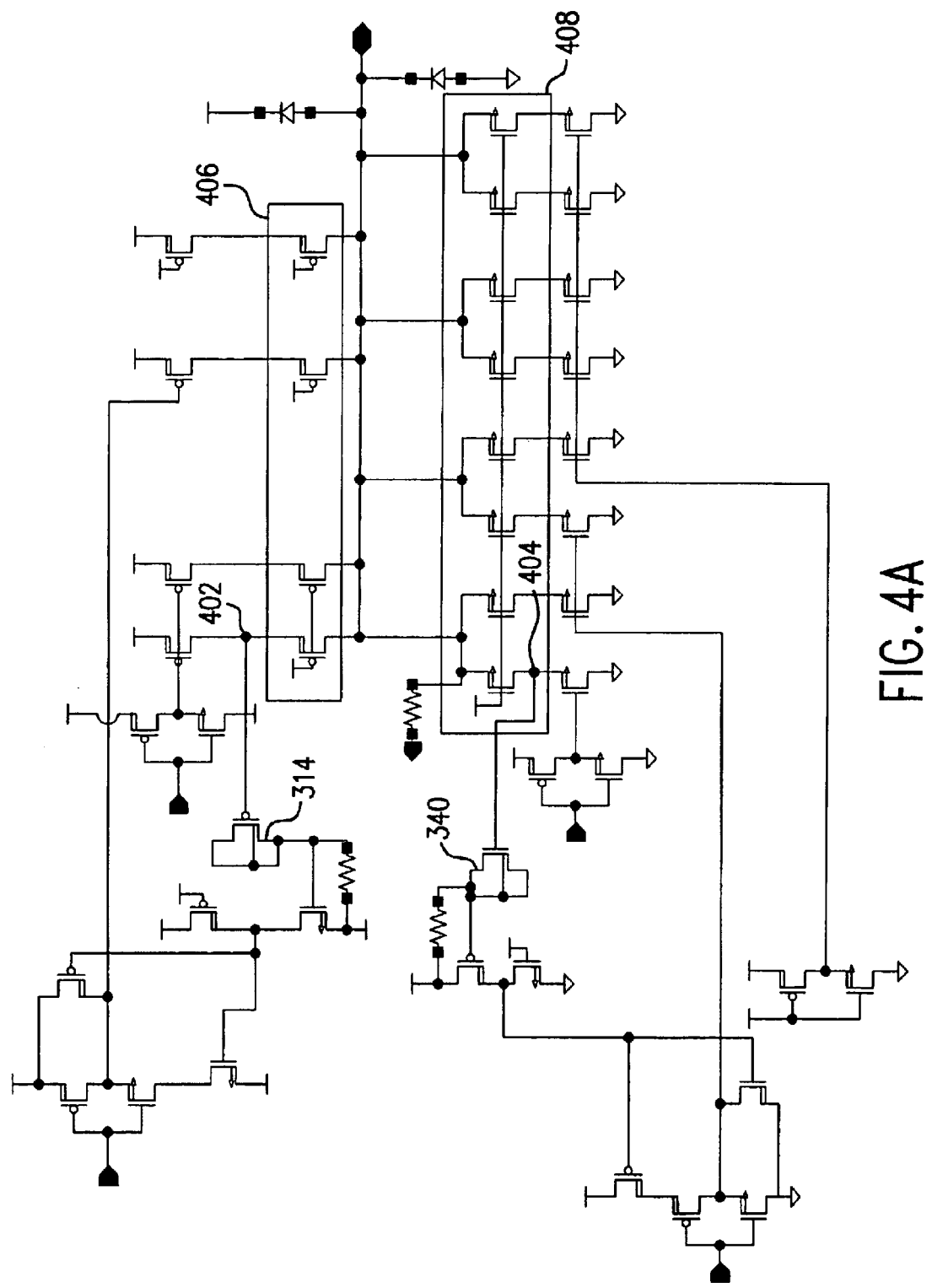
FIG. 4A is an example schematic diagram for the I/O circuit of FIG. 2, including rising edge protection circuitry and falling edge protection circuitry.

When multiple fingers are provided, a separate load sensor is provided for each finger or group of fingers. For example, FIG. 5A is an example schematic diagram of an I/O circuit 500, wherein a rising edge portion includes multiple rising edge load sensors 502a and 502b, corresponding rising edge variable output driver controls 504a and 504b, and corresponding rising edge variable output drivers, or fingers, 506a and 506b. Similarly, a falling edge portion includes multiple falling edge load sensors 508a and 508b, corresponding falling edge variable output driver controls 510a and 510b, and corresponding falling edge variable output drivers, or fingers, 512a and 512b. The I/O circuit 500 further includes protection circuitry 406 and 408 described below with respect to FIGS. 4A and 4B.

Figure 5A:
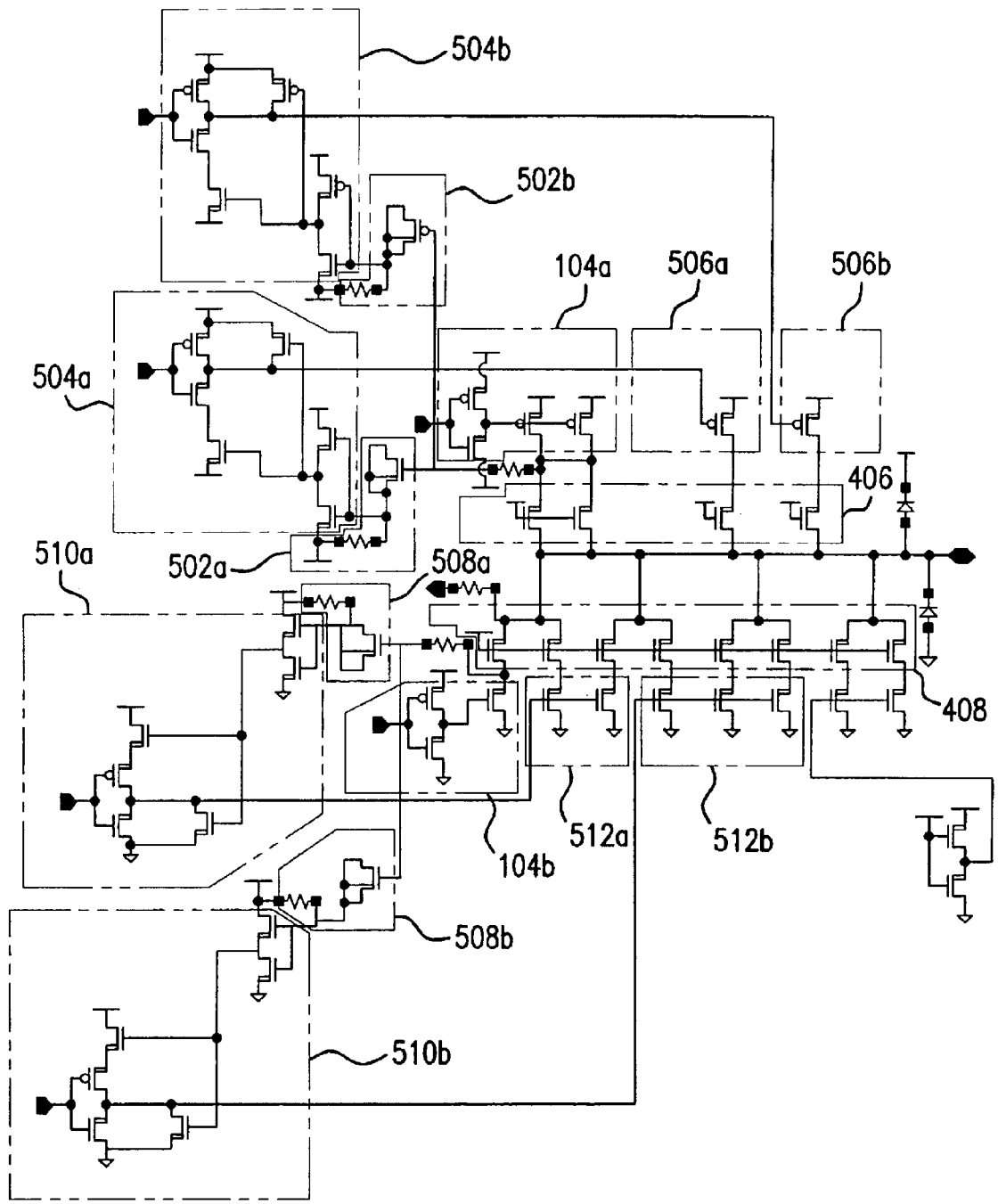
FIG. 5A is an example schematic diagram of the I/O circuit of FIG. 1, including multiple load sensors and corresponding supplemental current sources, in accordance with an aspect of the invention.
Figure 5B:
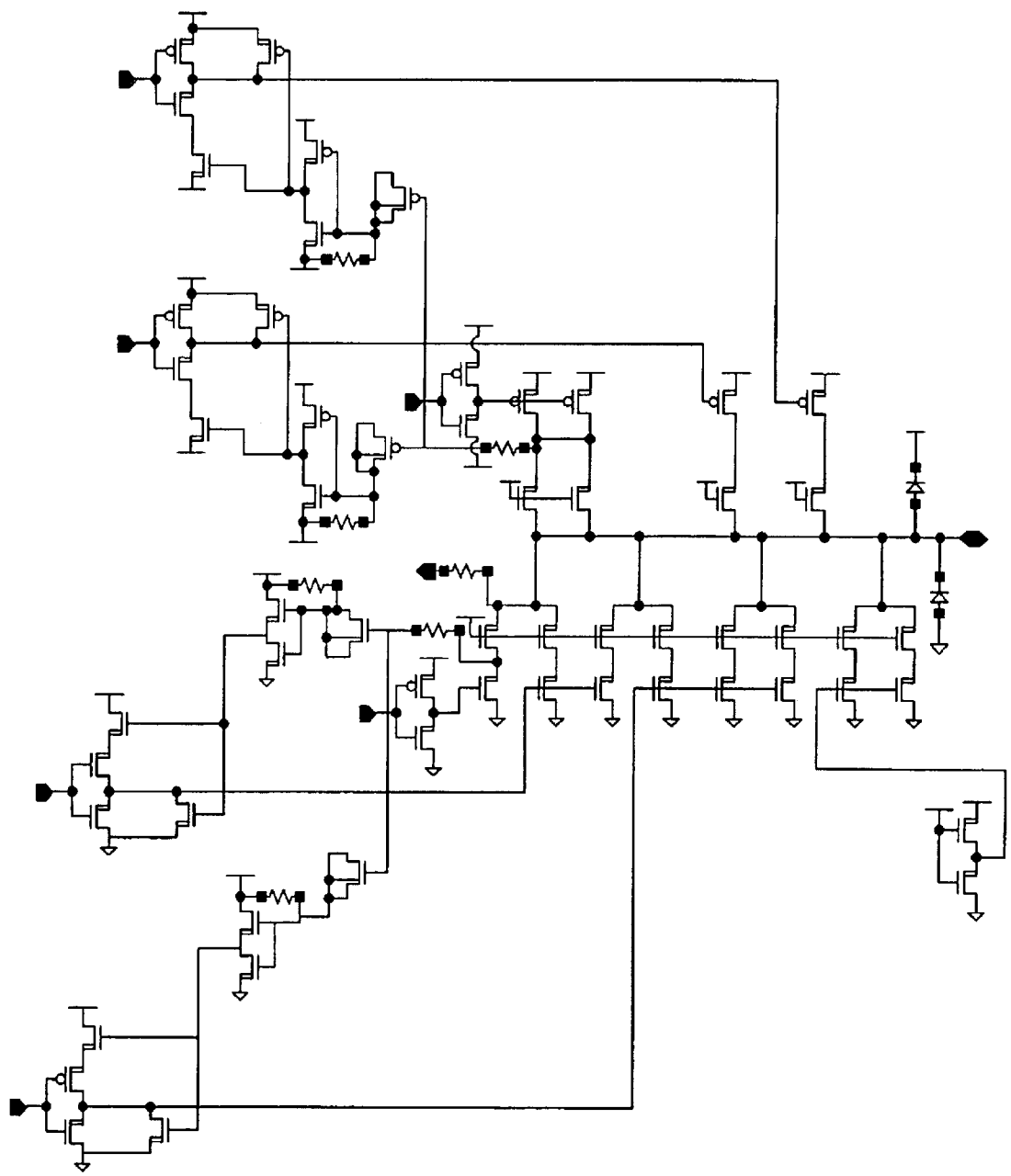
FIG. 5B illustrates example component characteristic values for the I/O circuit of FIG. 5A.

FIG. 5B illustrates the I/O circuit 500 with example component characteristic values. The invention is not, however, limited to the example of FIG. 5B. Based on the description herein, one skilled in the relevant art(s) will understand that the I/O circuit 500 illustrated in FIG. 5A can be implemented with other component characteristic values as well.

In an embodiment, the capacitance Cf (Cfn and/or Cp), illustrated in FIG. 3B, is implemented with one or more conventional discrete capacitors. Alternatively, or additionally, the capacitance Cf is implemented with one or more MOS capacitors. When the capacitance Cf is implemented with one or more MOS capacitors, if the oxide thickness increases due to process variations, the current capability of the PMOS driver and/or NMOS driver increases as well, as does the capacitance Cf, so that the dV/dt that is sensed by capacitance Cf remains relatively constant with process variations. The same applies when the oxide thickness decreases.

The I/O circuit 100 optionally includes protection circuitry for higher voltage (e.g., 5 volt) tolerance. FIG. 4A is an example schematic diagram of the I/O circuit 100, including rising edge protection circuitry 406 and falling edge protection circuitry 408. The rising edge capacitor 314 is coupled to a node 402, which is coupled to the output node 122 through the rising edge protection circuitry 406. A falling edge capacitor 342 is coupled to a node 404, which is coupled to the output node 122 through the falling edge protection circuitry 408.

Figure 4B:
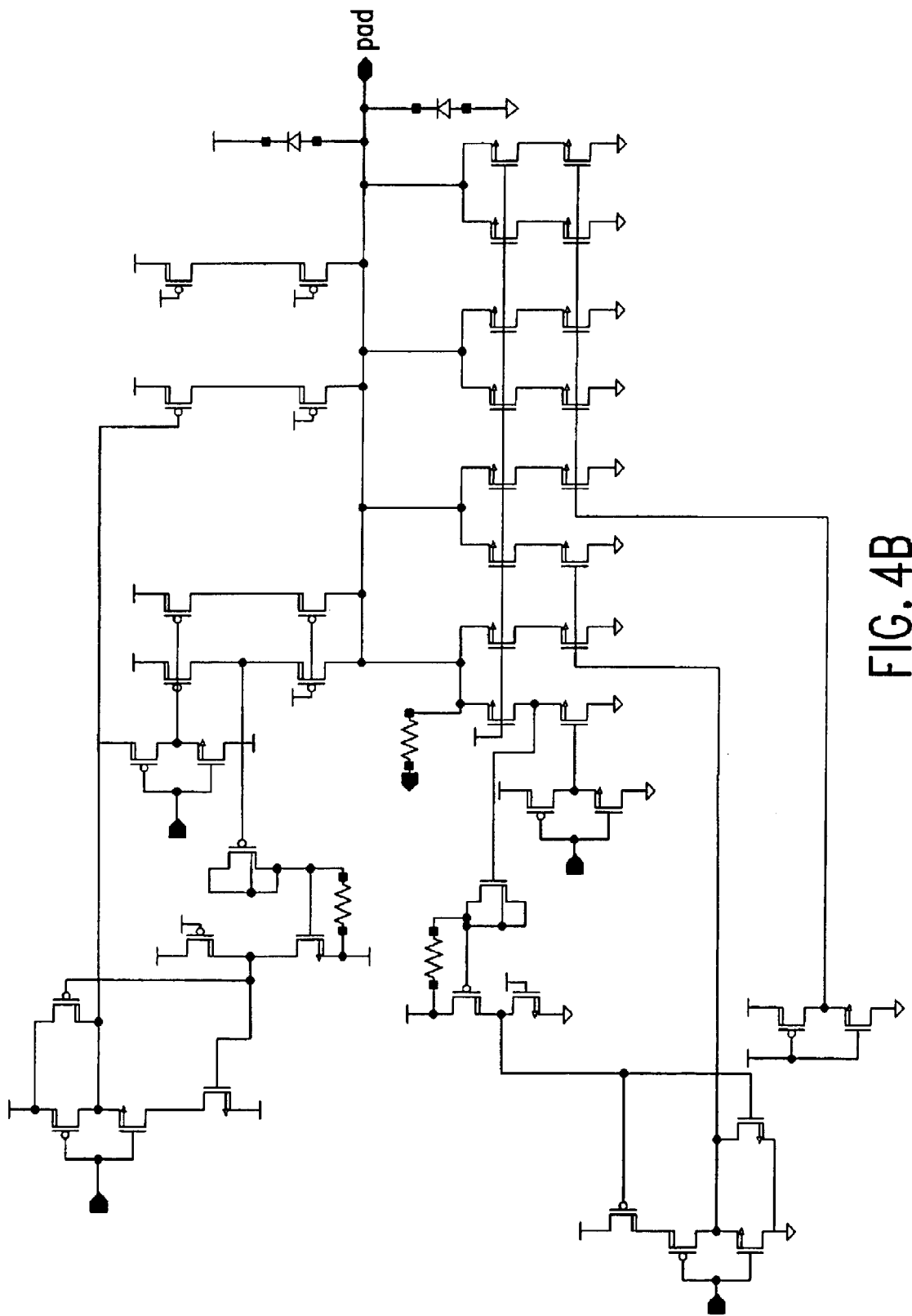
FIG. 4B illustrates example component characteristic values for the I/O circuit of FIG. 4A.

FIG. 4B illustrates the I/O circuit 100 of FIG. 4A with example component characteristic values. The invention is not, however, limited to the example of FIG. 4B. Based on the description herein, one skilled in the relevant art(s) will understand that the I/O circuit 100 illustrated in FIG. 4A can be implemented with other component characteristic values as well.

Figure 6:
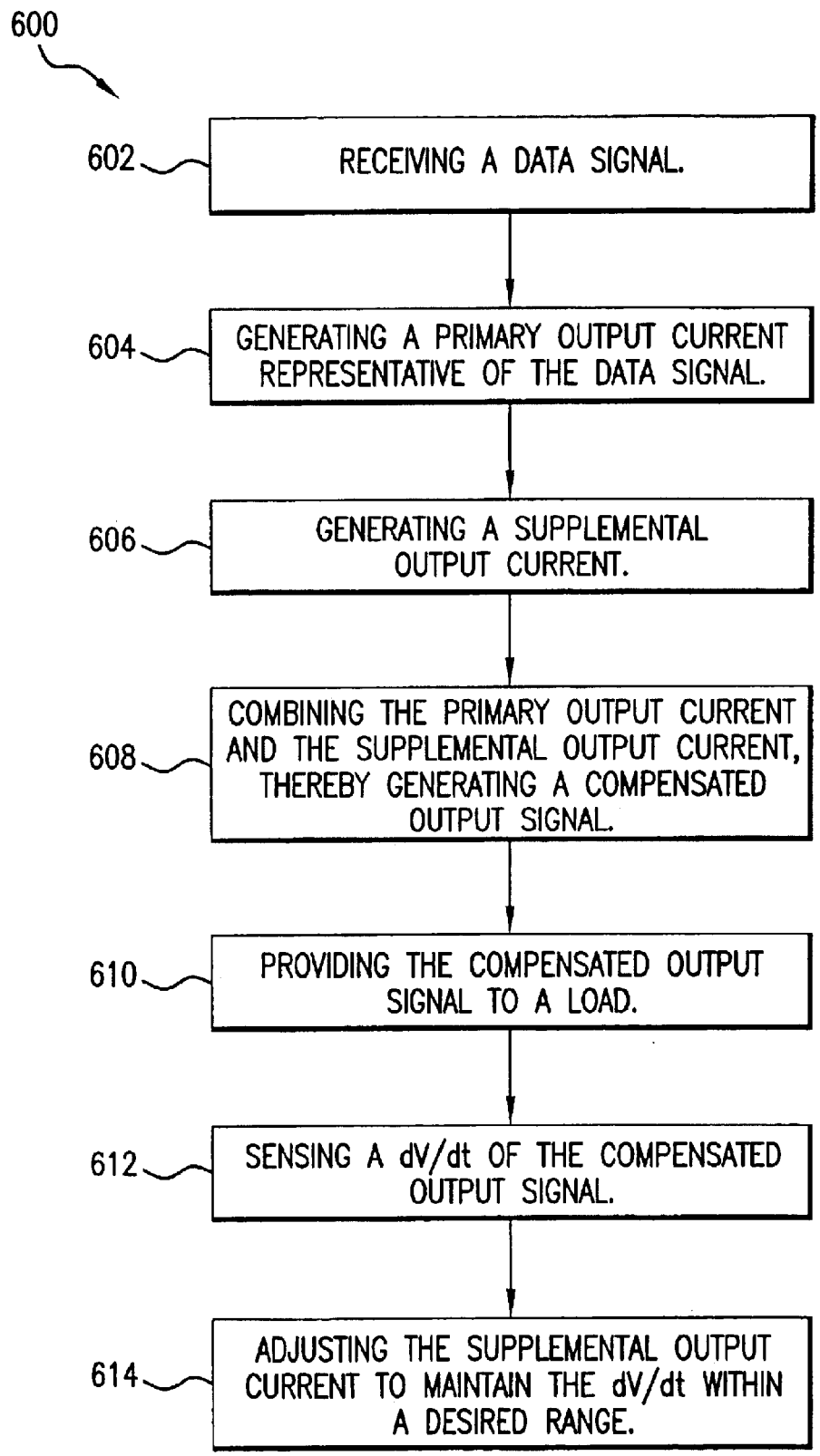
FIG. 6 is a process flowchart for sensing load conditions and for adjusting output current drive according to the sensed load conditions to maintain one or more desired signal characteristics, in accordance with an aspect of the invention.

FIG. 6 is a process flowchart 600 for sensing load conditions and for adjusting output current drive according to the sensed load characteristics to maintain one or more desired signal characteristics. Load conditions are sensed by monitoring one or more signal characteristics that are affected by load conditions, such as voltage changes with respect to time. Output current drive is then adjusted as needed to maintain the one or more desired signal characteristics. For illustrative purposes, the process flowchart 600 is described with reference to one or more of the previous drawing figures. The invention is not, however, limited to implementation with the previous drawing figures.

The process begins with step 602, which includes receiving a data signal. In FIG. 1, this is illustrated by the input data signal 114 at the input node 112.

Step 604 includes generating a primary output current representative of the data signal. In FIG. 1, the primary output driver 108 outputs the output data signal 116. In an embodiment, the primary output driver 108 is a current source.

Step 606 includes generating a supplemental output current. In FIG. 1, the supplemental output driver 107 generates the supplemental current 124. More particularly, the variable output driver 110 generates the supplemental current 124 according to the variable output driver control signal 120, received from the variable output driver control 108, as described above.

Step 608 includes combining the primary output current and the supplemental output current, thereby generating a compensated output signal. In FIG. 1, the output data signal 116 and the supplemental output current 124 are combined by the summing node 109, resulting in a compensated output signal 126. Where, as in this example, the output data signal 116 and the supplemental current 124 are both currents, the summing node 109 can be an electrical connection.

Step 610 includes providing the compensated output signal to a load. In FIG. 1, the compensated output signal 126 is coupled to a load 102 at the output node 122.

Step 612 includes sensing a dV/dt of the compensated output signal. In FIG. 1, the load sensor 106 senses one or more characteristics of the compensated output signal 126. In FIG. 3A, the rising edge load sensor 106a and the falling edge load sensor 106b each include a capacitance and a resistance to sense the dV/dt of the rising and falling edges, respectively, of the compensated output signal 126. The capacitance generates a current proportional to the dV/dt, and the resistance generates a voltage from the current. The voltage is substantially proportional to the dV/dt. The voltage is output as the sensor signal 118.

Step 614 includes adjusting the supplemental output current to maintain the dV/dt within a desired range. In FIG. 1, the supplemental output driver 107 adjusts the supplemental current 124, according to the sensed dV/dt. More particularly, the variable output driver 110 increases the supplemental output current 124 as the sensor signal 118 voltage (i.e., the dV/dt) decreases, and decreases the supplemental output current 124 as the sensor signal 118 voltage increases.

The supplemental output driver 107 substantially maintains the dV/dt within a desired range. For example, the supplemental output driver 107 increases the supplemental output current 124 when the dV/dt is below a threshold value, and decreases the supplemental output current 124 when the dV/dt is above the threshold value.

In an embodiment, the supplemental output driver 107 substantially maintains the dV/dt within a desired range for a range of load values such as, for example, 50 pF to 600 pF.

In an embodiment, steps 612 and 614 are performed separately for rising and falling edges. This tends to simplify circuit design. In an embodiment, step 612 and/or step 614 is performed only during rising and/or falling edges of the data, not during steady state conditions of the data.

The present invention has been described above with the aid of functional building blocks illustrating the performance of specified functions and relationships thereof. The boundaries of these functional building blocks have been arbitrarily defined herein for the convenience of the description. Alternate boundaries can be defined so long as the specified functions and relationships thereof are appropriately performed. Any such alternate boundaries are thus within the scope and spirit of the claimed invention. One skilled in the art will recognize that these functional building blocks can be implemented by discrete components, application specific integrated circuits, processors executing appropriate software and the like or any combination thereof.

While various embodiments of the present invention have been described above, it should be understood that they have been presented by way of example only, and not limitation. Thus, the breadth and scope of the present invention should not be limited by any of the above-described exemplary embodiments, but should be defined only in accordance with the following claims and their equivalents.

What is claimed is:

1. A method for providing load-adaptive output current drive, comprising:

sensing load conditions by generating a sensor signal having a voltage substantially proportional to one or more signal characteristics of a signal at an output node coupled to a load, said one or more signal characteristics being affected by said load conditions;

generating a supplemental drive current according to said voltage to maintain said one or more signal characteristics within a desired range; and combining said supplemental drive current with a primary output current to provide a compensated output signal to said output node;

whereby said one or more signal characteristics of said compensated output signal are substantially maintained within said desired range over a range of said load conditions.

2. The method according to claim 1, wherein said load conditions include variations in load impedance from about 50 pF to about 600 pF.

3. The method according to claim 1, wherein said sensing load conditions and said generating a supplemental drive current are performed during rising edges and falling edges of said signal at said output node.

4. A method for providing a load-adaptive output current drive, comprising:

sensing a change in voltage with respect to time ("dV/dt") of an output signal provided to a load at an output node by generating a sensor signal having a voltage substantially proportional to said dV/dt;

generating a supplemental drive current;

reducing said supplemental drive current when said voltage increases until said sensed dV/dt is within a desired range for a range of load values;

increasing said supplemental drive current when said voltage decreases until said sensed dV/dt is within said desired range for said range of load values; and combining said supplemental drive current with a primary output current.

5. The method according to claim 4, wherein said range of load values is from about 50 pF to about 600 pF.

6. The method according to claim 4, wherein said sensing a dV/dt of an output signal and said generating a supplemental drive current are performed during rising edges and falling edges of said output signal.

7. The method according to claim 4, wherein said step of sensing a dV/dt further comprises:

coupling a capacitance to said output node;

generating a current with said capacitance; and generating said voltage from said current that is substantially proportional to said dV/dt.

8. The method according to claim 7, wherein said capacitance comprises one or more discrete capacitors.

9. The method according to claim 7, wherein said capacitance comprises one or more PMOS transistors configured as capacitors.

10. A load-adaptive output current driver, comprising:

a primary output current driver that generates a primary output current in response to a received signal;

a load sensor coupled to an output node, said load sensor generating a sensor signal having a voltage substantially proportional to one or more signal characteristics at said output node, said one or more signal characteristics being affected by load conditions at said output node;

a supplemental output driver coupled to receive said sensor signal, said supplemental output driver controller generating a supplemental drive current in response to said voltage to maintain said one or more signal characteristics within a desired range for a range of said load conditions; and a summing node coupled to receive said primary output current and said supplemental drive current, said summing node combines said primary output current and said supplemental drive current to provide a compensated output signal to said output node.

11. The load-adaptive current driver according to claim 10, wherein said load conditions include variations in load impedance from about 50 pF to about 600 pF.

12. The load-adaptive current driver according to claim 10, wherein said primary output driver, said load sensor, and said supplemental output driver include rising edge portions and falling edge portions to separately maintain said one or more signal characteristics for rising and falling edges of said received signal.

13. The load-adaptive current driver according to claim 10, comprising:

a plurality of load sensors; and a plurality of supplemental output drivers configured to generate additional supplemental drive current in order to maintain said one or more signal characteristics within said desired range for said range of said load conditions.

* * * * *

UNITED STATES PATENT AND TRADEMARK OFFICE
CERTIFICATE OF CORRECTION

PATENT NO. : 6,859,069 B2 Page 1 of 1
DATED : February 22, 2005
INVENTOR(S) : Janardhanan S. Ajit It is certified that error appears in the above-identified patent and that said Letters Patent is hereby corrected as shown below:

<u>Title page,</u>
Item [*] Notice, please insert:
-- This patent is subject to a terminal disclaimer. --

Signed and Sealed this

Seventh Day of June, 2005

JON W. DUDAS
*Director of the United States Patent and Trademark Office*